United States Patent [19]

Yoshikawa

[11] Patent Number: 5,229,632
[45] Date of Patent: Jul. 20, 1993

[54] ELECTRICALLY ERASABLE MEMORY DEVICE HAVING ERASE-ELECTRODE CONNECTED TO SUBSTRATE JUNCTION

[75] Inventor: Kuniyoshi Yoshikawa, Tokyo, Japan

[73] Assignee: Kabushiki Kaisha Toshiba, Kawasaki, Japan

[21] Appl. No.: 656,794

[22] Filed: Feb. 19, 1991

[30] Foreign Application Priority Data

Feb. 19, 1990 [JP] Japan ................................. 2-36323

[51] Int. Cl.$^5$ ...................... H01L 29/68; G11C 11/34
[52] U.S. Cl. ..................... 257/320; 257/321; 365/185
[58] Field of Search ............ 357/23.5; 365/185; 257/320, 321

[56] References Cited

U.S. PATENT DOCUMENTS

| 4,437,174 | 3/1984 | Matsuoka | 365/218 |
| 4,839,705 | 6/1989 | Tigelaar et al. | 357/23.5 |
| 5,036,378 | 7/1991 | Lu et al. | 357/23.5 |

FOREIGN PATENT DOCUMENTS

| 0282022 | 9/1988 | European Pat. Off. . |
| 0349774 | 1/1990 | European Pat. Off. . |
| 60-117656 | 6/1985 | Japan . |

Primary Examiner—Rolf Hille
Assistant Examiner—Robert Limanek
Attorney, Agent, or Firm—Banner, Birch, McKie & Beckett

[57] ABSTRACT

A nonvolatile semiconductor device according to the present invention comprises a memory cell array having memory cells arranged in a matrix, each emory cell being composed of a floating gate electrode, control gate electrode, a source diffusion layer, and drain diffusion layer, tunnel oxide films formed on the side walls of the floating gate electrodes on the side where adjacent memory cells, sharing the control gate electrode, face each other, and an erasure gate electrode formed so as to sandwich the tunnel oxide films between the floating gate electrodes and itself, and electrically connected to the source diffusion layer at nearly an equal distance from the adjacent memory cells sharing the control gate electrode.

31 Claims, 10 Drawing Sheets

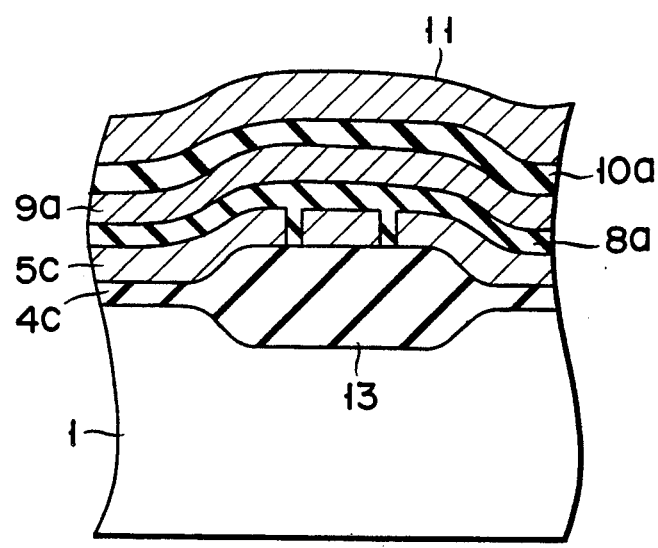
F I G. 5

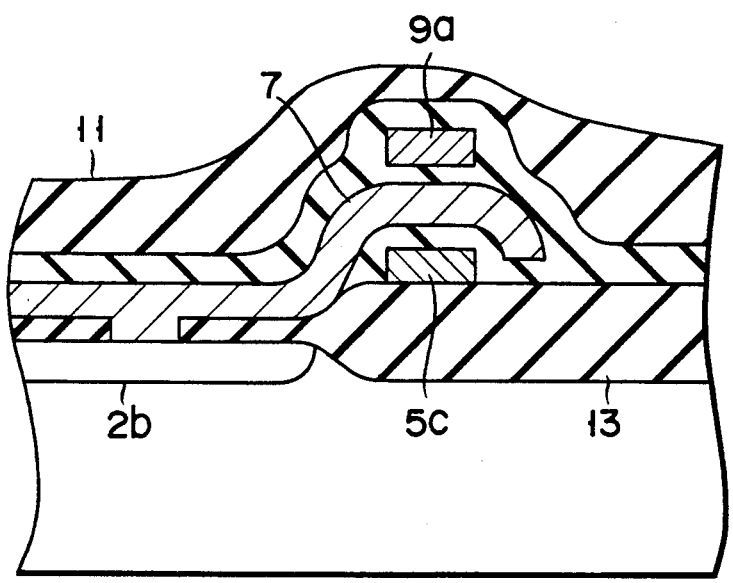
F I G. 12

ELECTRICALLY ERASABLE MEMORY DEVICE HAVING ERASE-ELECTRODE CONNECTED TO SUBSTRATE JUNCTION

BACKGROUND OF THE INVENTION

1. Field of the Invention

This invention relates to improvements in an electrically reprogrammable nonvolatile memory device having a gate electrode structure of two or more layers.

2. Description of the Related Art

A Flash EEPROM consisting of a single transistor/cell, which are replacing ultraviolet erasable EPROM, have been attracting attention these days in the field of nonvolatile semiconductor memory devices. FIG. 1 shows a cell transistor of the Flash EEPROM having a two-layer polycrystalline silicon gate structure. In a p-type silicon substrate 21, a source diffusion layer 22 and a drain diffusion layer 23 are formed. The depth of the source diffusion layer 22 is such that its junction break down voltage is sufficiently larger than a voltage applied to the source diffusion layer 22 during erasure operation. Formed on the p-type silicon substrate 21 between the source diffusion layer 22 and drain diffusion layer 23 is a gate oxide film 24, on which a floating gate electrode 25 is formed. On the floating gate electrode 25, an insulating film 26 is formed, on which a control gate 27 is formed.

Operation of the cell transistor of the Flash EEPROM will be explained hereinafter in FIG. 1. As with ultraviolet erasable EPROM, the writing of information is achieved by applying a high voltage to the control gate electrode 27 and drain diffusion layer 23, injecting hot electrons generated by the high electric field into the floating gate electrode 25, and storing therein to cause the transistor's threshold voltage value to increase. The information is erased by applying a high voltage (hereinafter, referred to as erasure voltage) to the source diffusion layer 22 and applying the GND potential on the control gate electrode 27. In this condition, an F.N tunneling current flows through the gate oxide film 24, extracting the stored electrons from the floating gate electrode 25 to the source diffusion layer 22.

The cell transistors of Flash EEPROM in FIG. 1 are generally constructed in array form and all the cell transistors in the array have the source diffusion layer 22 in common. This enables simultaneous erasure of the information stored in all cell transistors. In addition, the common source diffusion layer 22 makes the cell area almost the same as that for the ultraviolet erasable EPROM.

However, to set the erasure voltage at a practical value, e.g., 12.5 V, it is necessary to make the gate oxide film 24 as thin as approximately 100 Å. This increases the probability that defects will develop in the gate oxide film 24, resulting in poorer production yields. The thinner gate oxide film causes gate-induced junction leakage current, together with the F.N tunneling current, to flow towards the substrate 21 and source diffusion layer 22. This prevents erasure of information from being performed adequately, thus interfering with the stable memory operation. Such drawbacks can be overcome by providing an internal charge pump circuit that has a very large power capacity. The size of the internal step-up circuit, however, becomes extremely large, making it impossible to obtain a practical chip size. An LSI external power supply could supply the erasure voltage (12.5 V), but this would conflict with the desire to simplify external power supplies to generate 5 V only.

SUMMARY OF THE INVENTION

To overcome the above problems, it is the object of the present invention to provide a nonvolatile semiconductor device that is a reliable as that of ultraviolet erasable EPROMs and enables electrical erasure with a single transistor cell.

To achieve the object, a nonvolatile semiconductor device comprises: a memory cell array having memory cells arranged in matrix, each memory cell containing floating gate electrodes, control gate electrodes, a source diffusion layer, and drain diffusion layers; tunnel oxide films each formed on the side walls of the floating gate electrodes on the side where adjacent memory cells, sharing the control gate electrode, face each other; and an erasure gate electrode formed so as to sandwich the tunnel oxide film between the floating gate electrode and itself, and electrically connected to the source diffusion layer or the drain diffusion layer at an equal distance from the adjacent memory cells sharing the control gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional view taken along line C—C' in FIG. 2;

FIG. 12 is a sectional view taken along line H—H' of FIG. 9; and

DETAILED DESCRIPTION OF THE PREFERRED EMBODIMENTS

Figure 1:
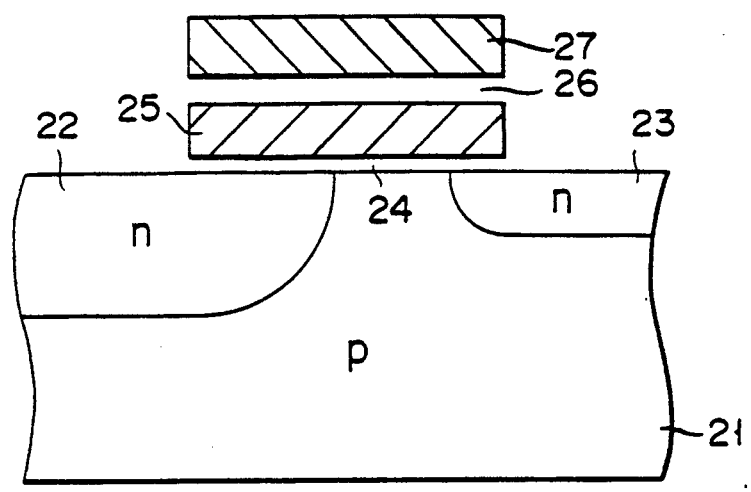
FIG. 1 is a sectional view for a cell transistor of a conventional nonvolatile semiconductor device.

Embodiments of the present invention will be explained in detail, referring to the accompanying drawings. Like parts are shown by corresponding reference characters throughout the several views of the drawings.

Figure 2:
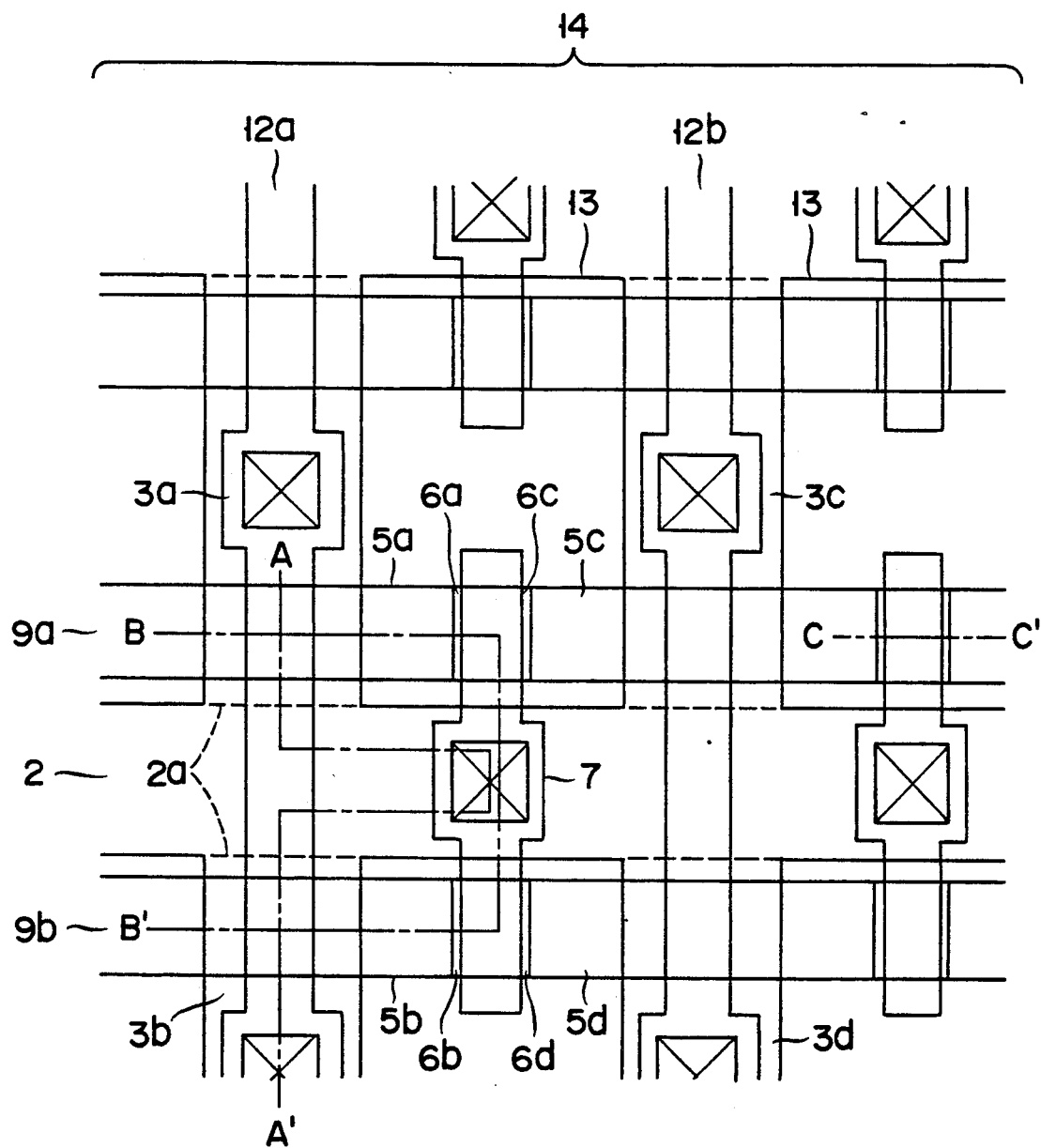
FIG. 2 is a sectional view for a nonvolatile memory device as a first embodiment of the present invention.
Figure 3:
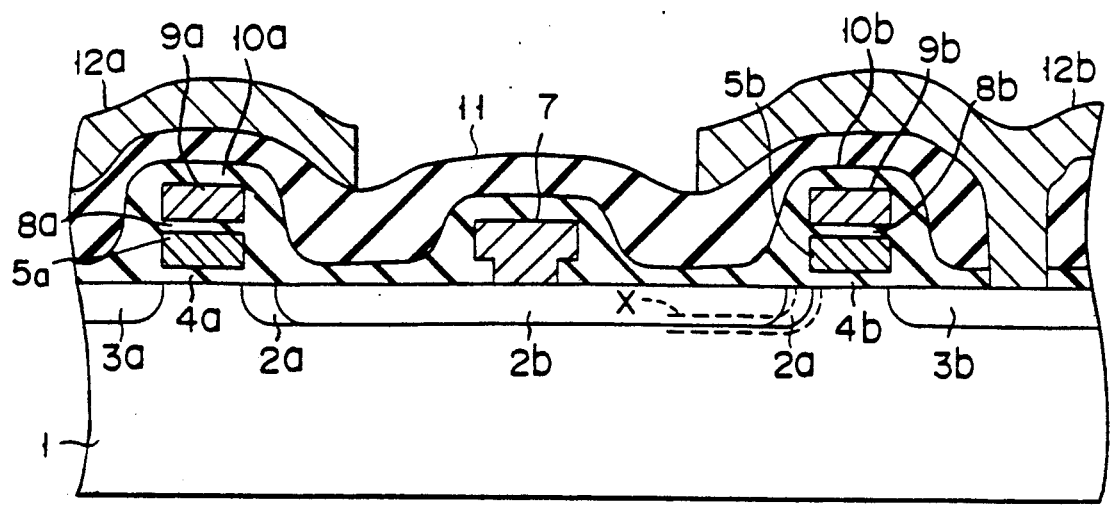
FIG. 3 is a sectional view taken along line A—A' in FIG. 2.
Figure 4:
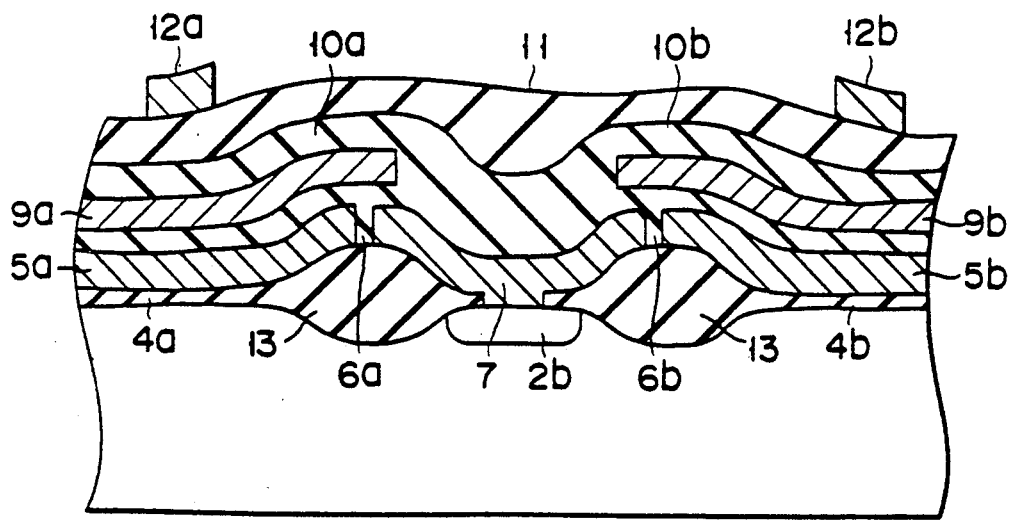
FIG. 4 is a sectional view taken along line B—B' in FIG. 2.

FIG. 2 shows a nonvolatile semiconductor device as a first embodiment according to the present invention. FIG. 3 is a sectional view taken along line A—A' in FIG. 2. FIG. 4 is a sectional view taken along line B—B' in FIG. 2. FIG. 5 is a sectional view taken along line C—C' in FIG. 2.

In the surface region of a p-type silicon substrate 1, a source diffusion layer 2 is formed. Also formed in the surface region of the p-type silicon substrate 1 are drain diffusion layers 3a, 3b, 3c, and 3d. On the channel regions between the source diffusion layer 2 and the drain diffusion layers 3a, 3b, 3c, and 3d, gate oxide films 4a, 4b, 4c, and 4d are formed. On the gate oxide films 4a, 4b, 4c, and 4d, floating gate electrodes 5a, 5b, 5c, and 5d are formed so that their end portions, except for those facing the source diffusion layer 2 and drain diffusion layers 3a, 3b, 3c, and 3d, are positioned over a field oxide film 13. The thickness of the field oxide film 13 is made so as to be sufficiently larger than that of the gate oxide films 4a, 4b, 4c and 4d which put the floating gate electrodes 5a, 5b, 5c, and 5d in an electrically floating state. For example, the ratio of the thickness of the field oxide film 13 to that of the gate oxide films 4a, 4b, 4c, and 4d are set at 10:1 or more. On the floating gate electrodes 5a, 5b, 5c, and 5d, insulating films 8a and 8b are formed. Formed on the insulating films 8a and 8b are control gate electrodes 9a and 9b.

The control gate electrode 9a is shared by the floating gate electrodes 5a and 5c, while the control gate electrode 9b is shared by the floating gate electrodes 5b and 5d. The source diffusion layer 2 is shared by memory cells that have the control gate electrodes 9a and 9b in common.

On the side where adjacent memory cells, sharing the control gate electrodes 9a and 9b, face each other, tunnel oxide films 6a, 6c, and 6b, 6d are formed on the side walls of the floating gate electrodes 5a, 5c, and 5b, 5d. An erasure gate electrode 7 is formed so as to sandwich the tunnel oxide films 6a and 6c between the floating gate electrodes 5a and 5c and itself, respectively. The erasure gate electrode 7 is shared by adjacent cells having the control gate electrodes 9a and 9b in common, while it is also shared by adjacent cells having the source diffusion layer 2 in common. Furthermore, the erasure gate electrode 7 is placed between the floating gate electrodes 5a and 5c and between the floating gate electrodes 5b and 5d. That is, the erasure gate electrode 7 is shared by four memory cells: two adjacent cells sharing the control gate electrodes 9a and 9b, and the other two adjacent cells sharing the source diffusion layer 2. Four memory cells sharing the erasure gate electrode 7 contain the source diffusion layer 2, drain diffusion layers 3a, 3b, 3c, and 3d, gate oxide films 4a, 4b, 4c, and 4d, floating gate electrodes 5a, 5b, 5c, and 5d, and control gate electrodes 9a and 9b. Those memory cells are arranged in a matrix to form a memory cell array 14. The erasure gate electrode 7 can be formed in a self-aligning manner between the floating gate electrodes 5a and 5b and between the floating gate electrodes 5c and 5d.

A part of the erasure gate electrode 7 is extended over the source diffusion layer 2 and electrically connected to the latter at an nearly equal distance from the adjacent cells sharing the control gate electrodes 9a and 9b. The location at which the erasure gate electrode 7 and source diffusion layer 2 are connected can be determined on the basis of the maximum potential applied to the erasure gate electrode 7. That is, as shown in FIG. 3, the location is selected so that the edge of a depletion layer developed in the source diffusion layer 2 (indicated by broken line X) does not touch or reach the floating gate edges (5a through 5d) adjacent to the source junction at the channel regions.

The source diffusion layer 2 contains a low-concentration region 2a and a high-concentration region 2b. The low-concentration region 2a is formed in a portion adjoining the channel region, while the high-concentration region 2b is formed so that the erasure gate electrode 7 includes at least a portion at which the erasure gate electrode 7 connects with the source diffusion layer 2. It is desirable that the low-concentration region 2a is set at a concentration on the order of approximately $10^{18}/cm^3$ and the high-concentration region 2b is set at a concentration one order or more higher than that of the low-concentration region 2a.

A CVD oxide film 10a and 10b is formed to cover the floating gate electrodes 5a, 5b, 5c, and 5d and control gate electrodes 9a and 9b. Over the surface, a BPSG film 11 is formed which has contact holes above the drain diffusion layers 3a, 3b, 3c, and 3d. Through the contact holes, bit lines 12a and 12b are formed so as to electrically connect with the drain diffusion layers 3a, 3b, 3c, and 3d.

The floating gate electrodes 5a, 5b, 5c, and 5d and control gate electrodes 9a and 9b can be formed using polysilicon, silicide, or a stacked structure of polysilicon and silicide, whereas the tunnel oxide films 6a, 6b, 6c, and 6d can be made up of polysilicon oxide film. The tunnel oxide films 6a, 6b, 6c, and 6d are formed well on the side walls of the floating gate electrodes 5a, 5b, 5c, and 5d by, for example, thermal oxidation or chemical vapor deposition. The erasure gate electrode 7 can be composed of, for example, polysilicon.

In the first embodiment, applying a suitable potential to the erasure gate electrode 7 causes charges in the floating gates 5a, 5b, 5c, and 5d to extract to the erasure gate 7 through the tunnel oxide films 6a, 6b, 6c, and 6d. This allows the nonvolatile semiconductor device to electrically reprogram information.

In this configuration, the tunnel oxide films 6a, 6b, 6c, and 6d are formed between the erasure gate electrode 7 and the side walls of the floating gate electrodes 5a, 5b, 5c, and 5d, which makes it possible to form the tunnel oxide films 6a, 6b, 6c, and 6d and the gate oxide films 4a, 4b, 4c, and 4d separately. This allows optimization of the tunnel oxide films 6a, 6b, 6c, and 6d according to erasure voltage. Since thinner gate oxide films 4a, 4b, 4c, and 4d are not needed for improvements in the erasure characteristics, the junction and surface breakdown voltages of the source diffusion layer 2 can be made sufficiently high. Further, no effect of the concentration in the source diffusion layer 2 adjoining the channel on the erasure characteristics sufficiently suppresses junction leakage current caused by a band-to-band tunneling phenomenon. Namely, use of a high voltage (e.g., 12.5 V) produced by the internal charge pump circuit as the erasure voltage enables operation of the nonvolatile semiconductor device from a single power supply (e.g., 5 V),.

While in the first embodiment, the erasure gate electrode 7 is electrically connected to the source diffusion layer 2, it may be electrically connected to the drain diffusion layers 3a, 3b, 3c, and 3d. In this case, the concentration in the drain diffusion layer 2 adjacent to the channel can be optimized based on the writing characteristics as with the first embodiment.

Figure 6:
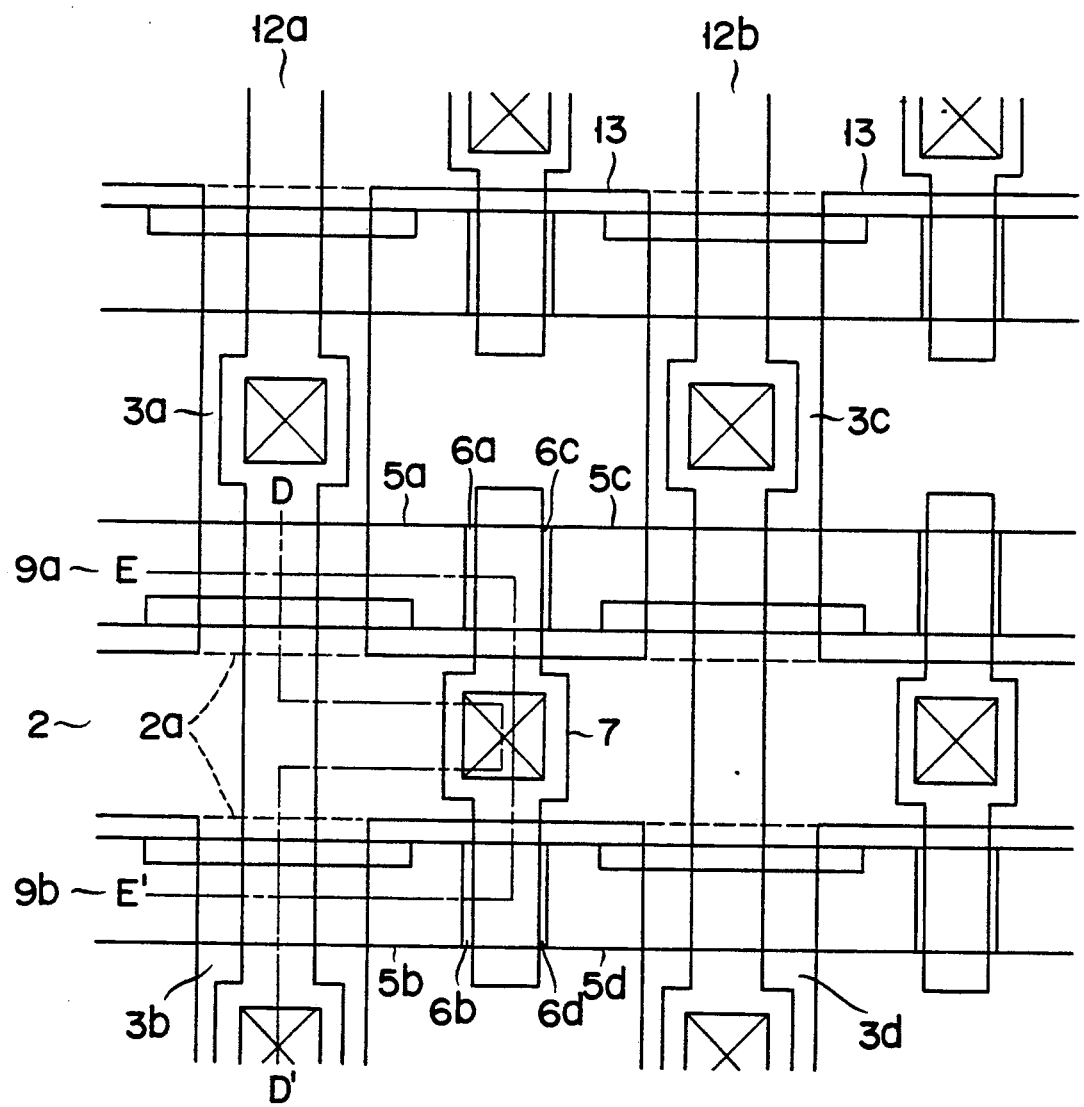
FIG. 6 is a sectional view of a nonvolatile semiconductor device as a second embodiment of the present invention.
Figure 7:
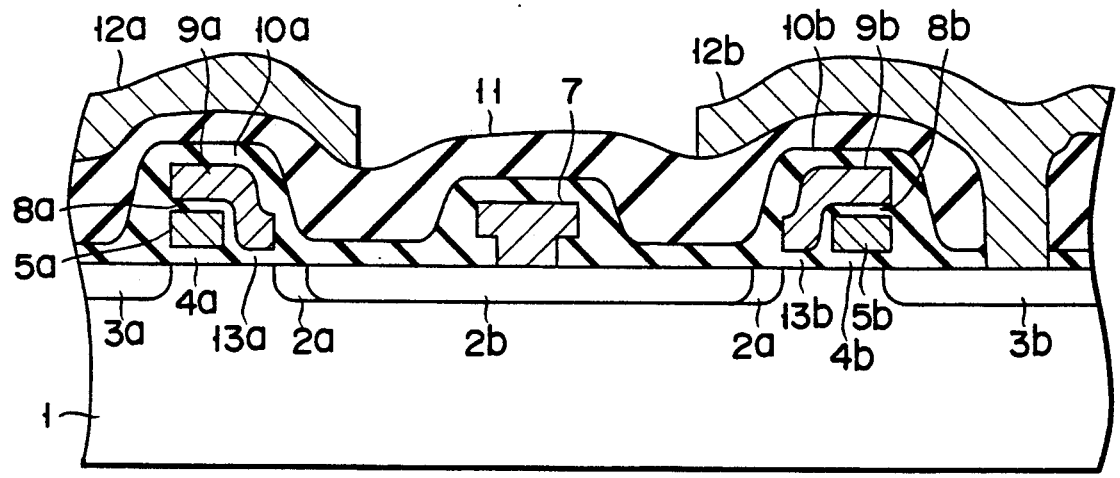
FIG. 7 is a sectional view taken on line D—D' of FIG. 6.
Figure 8:
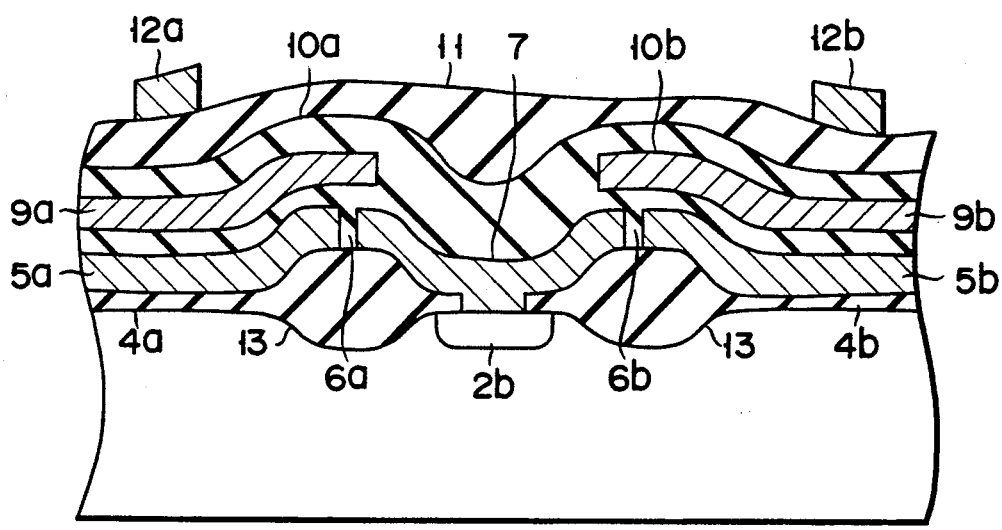
FIG. 8 is sectional view taken on line E—E' of FIG. 6.

FIG. 6 illustrates a nonvolatile semiconductor device as a second embodiment of the present invention. FIG. 7 is a sectional view taken along line D—D' in FIG. 6 and FIG. 8 is a sectional view taken on line E—E' of FIG. 6.

In the surface region of a p-type silicon substrate 1, a source diffusion layer 2, and drain diffusion layers 3a, 3b, 3c, and 3d are formed. Above the channel regions between the source diffusion layer 2 and drain diffusion layers 3a, 3b, 3c, and 3d, gate oxide films 4a, 4b, 4c, and 4d are formed. On the gate oxide films 4a, 4b, 4c, and 4d close to the drain diffusion layers 3a, 3b, 3c, and 3d, floating gate electrodes 5a, 5b, 5c, and 5d are formed. On the floating gate electrodes 5a, 5b, 5c, and 5d, insulating films 8a and 8b are formed. On the insulating films 8a and 8b and above the gate oxide films 13a, 13b, 13c, and 13d close to the source diffusion layer 2, control gate electrodes 9a and 9b are formed so as to have what is called an offset structure.

On the side where the adjacent memory cells, sharing the control gate electrode 9a, face each other, tunnel oxide films 6a and 6c are formed on the side walls of the floating gate electrodes 5a and 5c. An erasure gate electrode 7 is formed so as to sandwich the tunnel oxide films 6a and 6c between the floating gate electrodes 5a and 5c and itself, respectively. A part of the erasure gate electrode 7 is extended to the source region to connect to the source diffusion layer 2 at an nearly equal distance from the adjacent memory cells sharing the control gate electrode 9.

The second embodiment has an offset structure consisting of the control gate electrodes 9a and 9b formed above the channel regions close to the source diffusion layer 2. With this arrangement, electrical conduction of the memory cell channels can be prevented even when overerasure occurs during the movement of charges from the floating gate electrodes 5a, 5b, 5c, and 5d to the gate electrode 7.

In this configuration, sufficiently thin tunnel oxide films 6a, 6b, 6c, and 6d are formed between the floating gate electrodes 5a, 5b, 5c, and 5d and the erasure gate electrode 7, which offers almost the same effects as in the first embodiment.

While in the second embodiment, the erasure gate electrode 7 is electrically connected to the source diffusion layer 2, it may be electrically connected to the drain diffusion layers 3a, 3b, 3c, and 3d.

Figure 9:
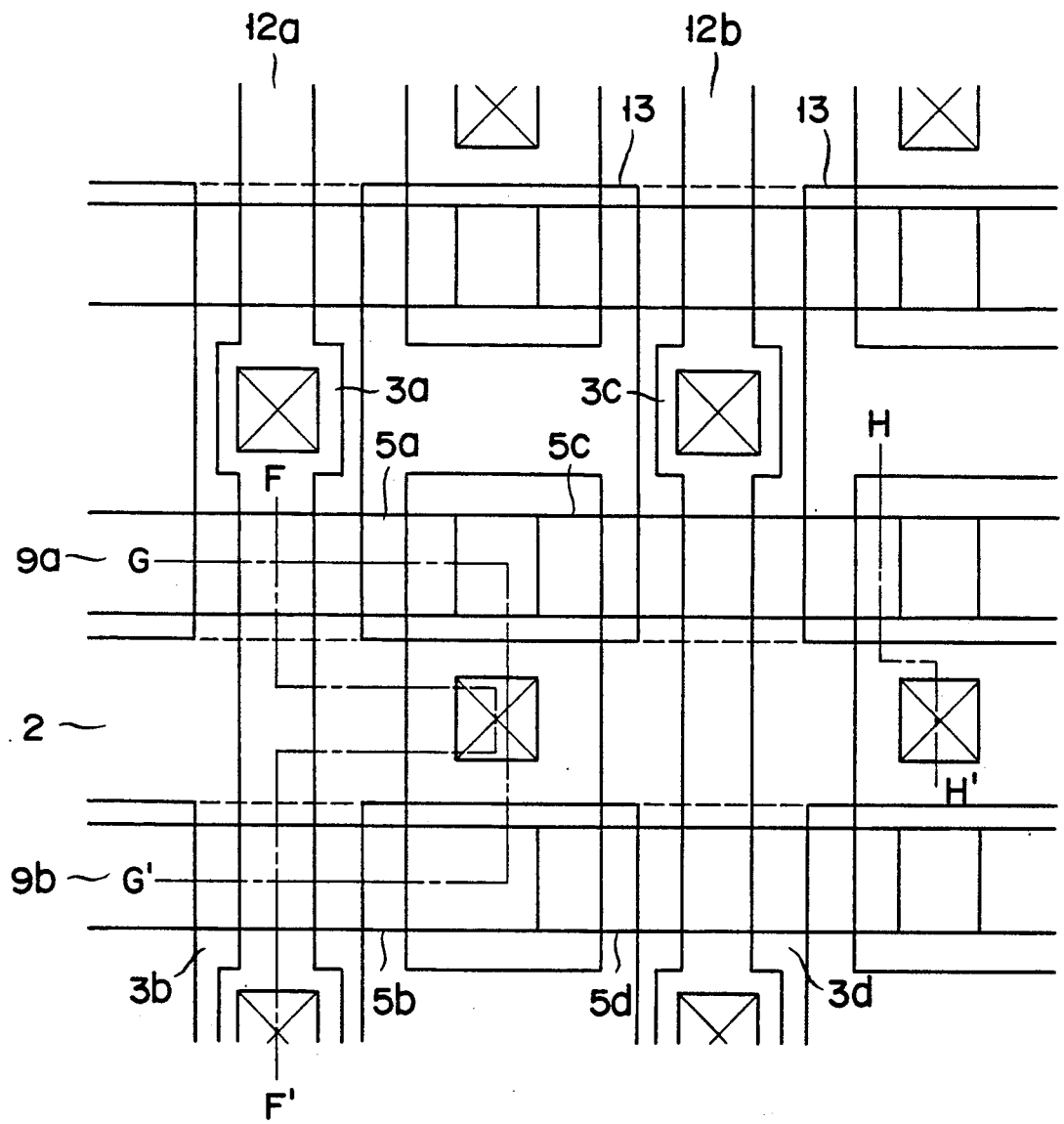
FIG. 9 is a sectional view for a nonvolatile semiconductor device as a third embodiment of the present invention.
Figure 10:
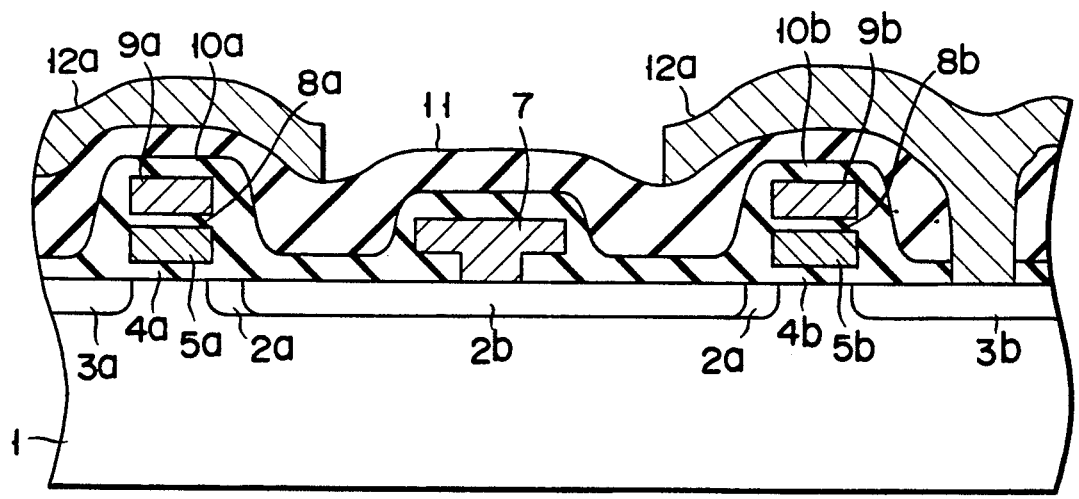
FIG. 10 is a sectional view taken along line F—F' of FIG. 9.
Figure 11:
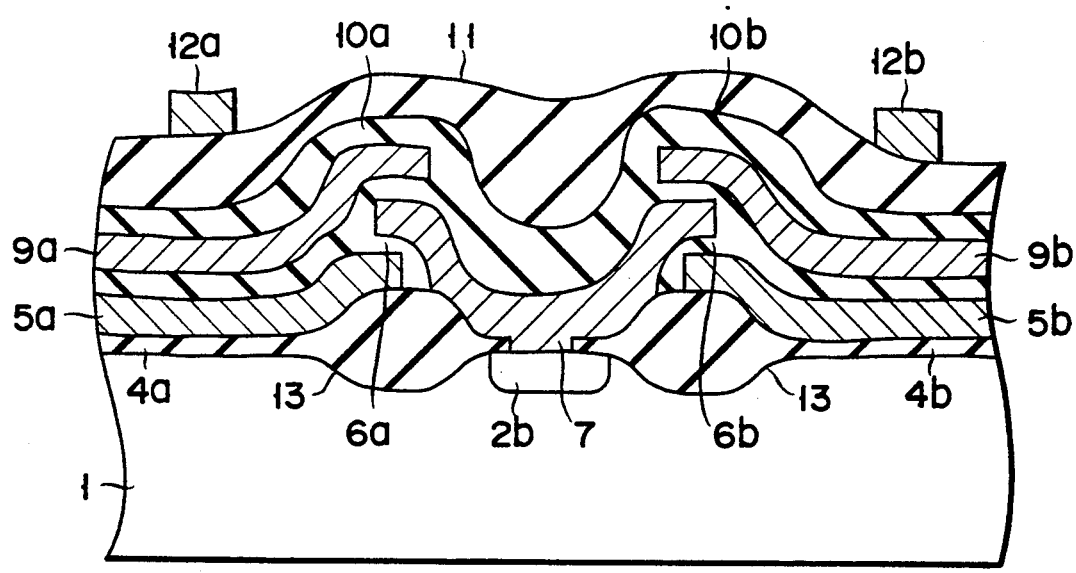
FIG. 11 is a sectional view taken along line G—G' of FIG. 9.

FIG. 9 shows a nonvolatile semiconductor device as a third embodiment of the present invention. FIG. 10 is a sectional view taken along line F—F' in FIG. 9. FIG. 11 is a sectional view taken on line G—G' in FIG. 9. FIG. 12 is a sectional view taken on line H—H' in FIG. 9.

In the surface region of a p-type silicon substrate 1, a source diffusion layer 2 and drain diffusion layers 3a, 3b, 3c, and 3d are formed. Above the channel regions between the source diffusion layer 2 and drain diffusion layers 3a, 3b, 3c, and 3d, gate oxide films 4a, 4b, 4c, and 4d are formed. On the gate oxide films 4a, 4b, 4c, and 4d, floating gate electrodes 5a, 5b, 5c, and 5d are formed. Above the gate electrodes 5a, 5b, 5c, and 5d, control gate electrodes 9a and 9b are formed via insulating film 8a and 8b. On the side where the adjacent cells sharing the control gate electrodes 9a and 9b face each other, tunnel oxide films 6a, 6b, 6c, and 6d are formed in a specific region containing the side walls of the floating gate electrodes 5a, 5b, 5c, and 5d. An erasure gate electrode 7 is formed so as to sandwich the tunnel oxide films 6a, 6b, 6c, and 6d between the floating gate electrodes 5a, 5b, 5c, and 5d and itself. The erasure gate electrode 7 is shared by the floating gate electrodes 5a, 5b, 5c, and 5d. A part of the erasure gate electrode 7 is extended over the source diffusion layer 2 and connected to the latter at an equal distance from the adjacent memory cells sharing the control gate electrodes 9a and 9b.

In this arrangement, the tunnel oxide films 6a, 6b, 6c, and 6d are formed between the erasure gate electrode 7 and the floating gate electrodes 5a, 5b, 5c, and 5d. A part of the erasure gate electrode 7 is connected to the source diffusion layer 2 at an nearly equal distance from the memory cells sharing the control gate electrodes 9a and 9b. Therefore, this configuration provides similar effects to those described in the first embodiment.

While in the third embodiment, the erasure gate electrode 7 is electrically connected to the source diffusion layer 2, it may be electrically connected to the drain diffusion layers 3a, 3b, 3c, and 3d.

Figure 13:
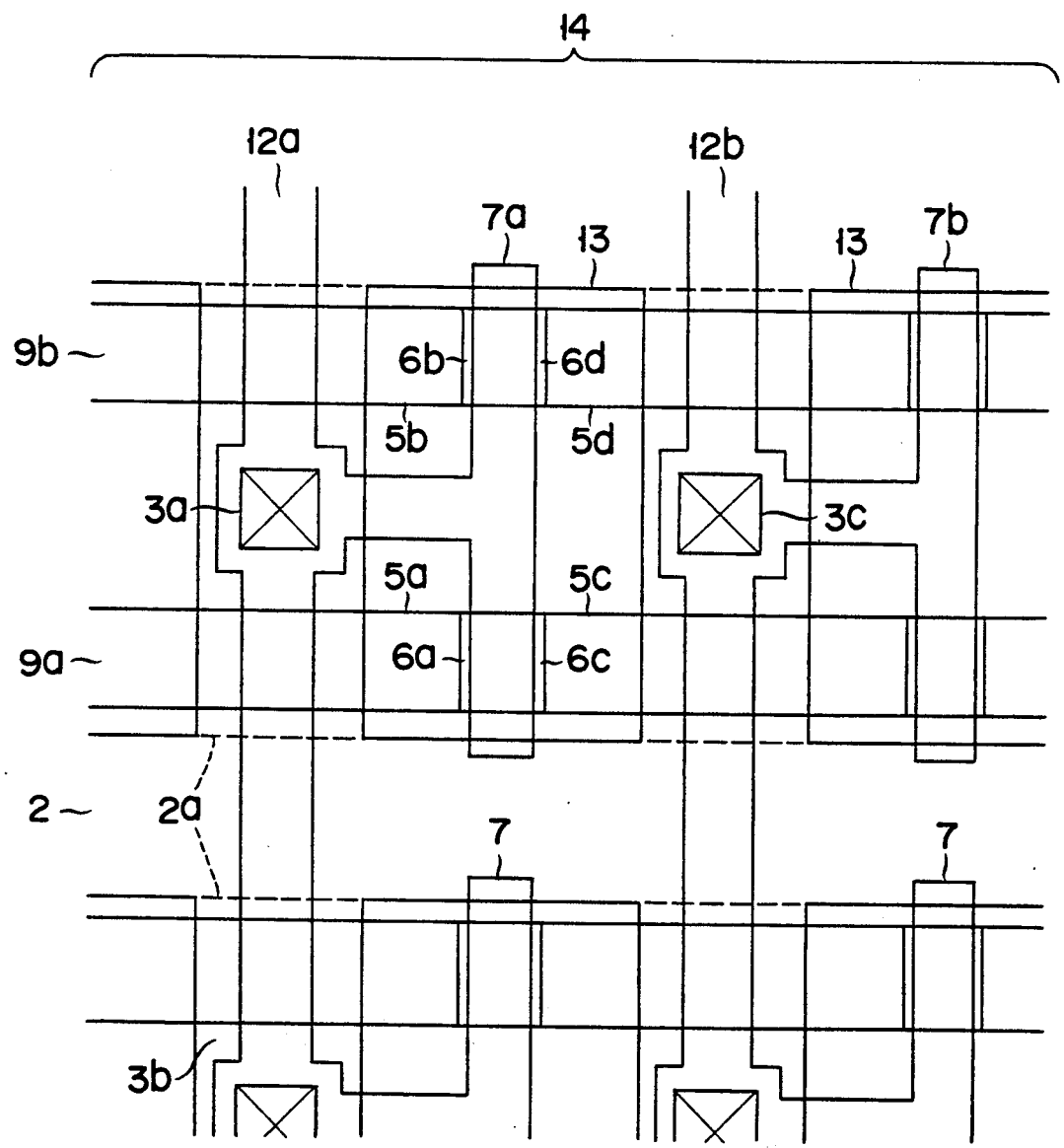
FIG. 13 is a sectional view for a nonvolatile memory device as a fourth embodiment of the present invention.

FIG. 13 shown a nonvolatile semiconductor device as a fourth embodiment of the present invention.

The control gate electrode 9a is shared by the floating gate electrodes 5a and 5c, while the control gate electrode 9b is shared by the floating gate electrodes 5b and 5d. The erasure gate electrode 7a is shared by adjacent cells having the drain diffusion layer 3a in common.

A part of the erasure gate electrode 7a is extended over the drain diffusion layer 3a and electrically connected to the latter at an nearly equal distance from the adjacent cells sharing the drain diffusion layer 3a. A part of the erasure gate electrode 7b is extended over the drain diffusion layer 3c and electrically connected to the latter at an nearly equal distance from the adjacent cells sharing the drain diffusion layer 3c.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A nonvolatile semiconductor device, comprising:
an array of memory cell transistors, each memory cell transistor comprising:
  (a) a source diffusion layer and a drain diffusion layer; and
  (b) a floating gate electrode at least partially overlying a channel region defined by said source and said drain diffusion layer;
control gate electrodes, each said control gate electrode partially overlying the floating gate electrode of at least two adjacent memory cell transistors;
erasure gate electrode arranged to remove charges from said floating gate electrodes, each said erasure gate electrode being electrically connected to a source diffusion layer substantially equidistant from memory cell transistors having a common control gate electrode; and tunnel oxide films, each tunnel oxide film formed between a side wall of a floating gate electrode and an erasure gate electrode having a common control gate electrode.

2. The nonvolatile semiconductor device according to claim 1, wherein a source diffusion layer is common to memory cell transistors having a common control gate electrode.

3. The nonvolatile semiconductor device according to claim 1, wherein said source diffusion layer or drain diffusion layer of each said memory cell transistor comprises a first impurity region having a first concentration located adjacent said channel region and a second impurity region having a second concentration located below said erasure gate electrode, the first concentration being lower than the second concentration.

4. The nonvolatile semiconductor device according to claim 1, wherein each said tunnel oxide film is formed between the side-wall of a floating gate electrode and a side wall of an erasure gate electrode having a common control gage electrode.

5. The nonvolatile semiconductor device according to claim 1, wherein charges in each said floating gate move through one of said tunnel oxide films to an erasure gate electrode when a specific potential is applied to said erasure gate electrode.

6. The nonvolatile semiconductor device according to claim 1, wherein each said erasure gate electrode is common to memory transistors having common control gate electrodes.

7. The nonvolatile semiconductor device according to claim 1, wherein each source diffusion layer is common to at least two memory cell transistors and wherein each said erasure gate electrode is common to the memory cell transistors in a row of the array which have a common control gate electrodes, and to the memory cell transistors in a column of the array which have a common source diffusion layer.

8. The nonvolatile semiconductor device according to claim 1, wherein said floating gate electrodes are made from one of polysilicon, silicide, and a stacked structure of both polysilicon and silicide.

9. The nonvolatile semiconductor device according to claim 1, wherein said control gate electrodes are made from one of polysilicon, silicide, and a stacked structure of polysilicon and silicide.

10. The nonvolatile semiconductor device according to claim 1, wherein said erasure gate electrodes are made from polysilicon.

11. The nonvolatile semiconductor device according to claim 1, wherein said tunnel oxide films are made from a polysilicon oxide film.

12. The nonvolatile semiconductor device according to claim 1, wherein each of said memory cell transistors is further composed of:

a semiconductor substrate, said source diffusion layer and drain diffusion layers being formed in a surface region of said semiconductor substrate;

a first insulating film formed above said channel region, said floating gate electrode being formed on said first insulating film; and a second insulating film formed on said floating gate electrode, a control gate electrode being formed on said second insulating film.

13. The nonvolatile semiconductor device according to claim 1, wherein each of said memory cell transistors is further composed of:

a semiconductor substrate, said source diffusion layer and drain diffusion layers being formed in a surface region of said semiconductor substrate;

a first insulating film formed above said channel region, said floating gate electrode being formed on said first insulating film; and a second insulating film formed on said floating gate electrode, a control gate electrode being formed on said second insulating film near said source diffusion layer.

14. A nonvolatile semiconductor device, comprising:

an array of memory cell transistors, each memory cell transistor comprising a source diffusion layer, a drain diffusion layer common to at least one other memory cell transistor, a floating gate at least partially overlying a channel region defined by the source and drain diffusion layer;

control gates, each said control gate overlying at least part of at least two floating gates;

erasure gate electrodes arranged to remove charges from said floating gate electrodes, each said erasure gate electrode being electrically connected to a drain diffusion layer at a point substantially equidistant from memory cell transistors having said drain diffusion layer in common; and tunnel oxide films, each said tunnel oxide film being formed between a side wall of a floating gate electrode and an erasure gate electrode which has a common control gate electrode.

15. A nonvolatile semiconductor memory device comprising:

a semiconductor body;

a source region in said semiconductor body;

first and second drain regions;

first and second floating gate electrodes respectively overlying first and second channel regions defined by said source regions and said first and second drain regions;

a control gate electrode at least partially overlying said first and second floating gate electrodes;

an erasure gate electrode arranged to remove charges from said first and second floating gate electrodes and being electrically connected to said source region;

a first oxide film formed between a side wall of said first floating gate electrode and said erasure gate electrode; and a second oxide film formed between a side wall of said second floating gate electrode and said erasure gate electrode.

16. A nonvolatile semiconductor device comprising:

an array of memory cell transistors, arranged in rows and columns, the memory cell transistors in each adjacent pair of columns having a common source diffusion layer, and each memory cell transistor having a drain diffusion layer and a floating gate electrode at least partially overlying a channel region defined by said common source diffusion layer and said drain diffusion layer;

control gate electrodes respectively overlying the floating gate electrodes of memory cell transistors in a column of said array;

bit lines respectively connected to the drain diffusion layers of memory cell transistors in a row of said array;

erase gate electrodes respectively provided for one of a plurality of memory cell transistor groups, each said memory cell transistor group being constituted by four memory cell transistors where each memory cell transistor in a memory transistor group is adjacent to two of the other three memory cell transistors in the group, wherein each of the erasure gate electrodes is provided for removing charges from the floating gate electrodes of the four memory cell transistors in the corresponding memory cell transistor group, and wherein each of the erasure gate electrodes is connected to a source diffusion layer common to the four memory cell transistors at a position which is substantially equidistant from connections between the drain diffusion layers of the four memory cell transistors and their corresponding bit lines; and a plurality of tunnel oxide films, one each being formed between and in contact with a side wall of the floating gate electrodes and the erasure gate electrodes in a memory cell transistor group.

17. The nonvolatile semiconductor device according to claim 16, wherein each of said source diffusion layers which are common to the memory cell transistors in each adjacent pair of columns of said array comprises:
a first impurity region having a first dopant concentration and which is located near the channel region; and
a second impurity region having a second dopant concentration and which is located below the erasure gate electrode, said first dopant concentration being lower than said second dopant concentration.

18. The nonvolatile semiconductor device according to claim 16, wherein charges in the floating gate electrodes of the four memory cell transistors of each of said memory cell transistor groups move through tunnel oxide films which are in contact with side walls of the floating gate electrodes when a specific potential is applied to the erasure gate electrode for each four memory cell transistors.

19. The nonvolatile semiconductor device according to claim 16, wherein each said floating gate electrode in said array of memory cell transistors is made from one of polysilicon, silicide, and a stacked structure of both polysilicon and silicide.

20. The nonvolatile semiconductor device according to claim 16, wherein said plurality of control gate electrodes are made from one of a group consisting of polysilicon, silicide, and a stacked structure of polysilicon and silicide.

21. The nonvolatile semiconductor device according to claim 16, wherein said plurality of erasure gate electrodes are made from polysilicon.

22. The nonvolatile semiconductor device according to claim 16, wherein each tunnel oxide film in said array of memory cell transistors is made from polysilicon oxide film.

23. A non-volatile semiconductor memory device, comprising:
a semiconductor body;
first and second current terminal regions in said semiconductor body;
a first insulating film over said semiconductor body;
a floating gate electrode on said first insulating film and overlying a channel region between said first and second current terminal regions;
a second insulating film on said floating gate electrode;
a control gate electrode formed on said second insulating film and overlying said floating gate electrode;
a bit line coupled to the second current terminal region;
an erase gate electrode for discharging said floating gate electrode and having an outermost side wall portion laterally spaced from and facing a side wall portion of said floating gate electrode; and
a tunnel oxide film sandwiched between the side wall portion of said floating gate electrode and said outermost side wall portion of said erase gate electrode.

24. The nonvolatile semiconductor device according to claim 23, wherein said erase gate electrode contacts said first current terminal region.

25. The nonvolatile semiconductor device according to claim 23, wherein said tunnel oxide film comprises a polysilicon oxide film.

26. A non-volatile semiconductor memory device, comprising:
first and second terminal regions of a row and column array of memory cell transistors;
a first insulating film;
floating gate electrodes formed on said first insulating film and overlying channel regions between respective ones of said first and second current terminal regions;
a second insulating film formed on said floating gate electrodes;
control gate electrodes formed on said second insulating film and overlying the floating gate electrodes of memory cell transistor in respective columns of said array;
bit lines coupled to the second current terminal regions of the memory cell transistors in respective rows of said array;
erase gate electrodes each having a first portion disposed between end portions of first and second adjacent floating gate electrodes in a first column of said array and a second portion disposed between end portions of first and second adjacent floating gate electrodes in a second column of said array; and
tunnel oxide films sandwiched between the end portions of said floating gate electrodes and side walls of said first and second portions of said erase gate electrodes.

27. The nonvolatile semiconductor device according to claim 26, wherein said first current terminals comprise current terminals common to memory cell transistors in adjacent columns of said array.

28. The nonvolatile semiconductor device according to claim 27, wherein said first current terminals comprise source terminals.

29. The nonvolatile semiconductor device according to claim 28, wherein said erase gate electrodes are in contact with the source terminal common to the first and second column of said array.

30. The nonvolatile semiconductor device according to claim 28, wherein said source terminals each comprise a low-concentration region adjacent said channels and a high concentration region in contact with said erase gate electrodes.

31. The nonvolatile semiconductor memory device according to claim 26, wherein said control gate electrodes have an offset structure relative to said floating gate electrodes such that a first portion of said control gate electrodes overlies said floating gate electrodes and a second portion of said control gate electrodes in spaced from said channel regions by said first insulating film.

* * * * *